United States Patent [19]

Hara

[11] Patent Number: 5,039,884
[45] Date of Patent: Aug. 13, 1991

[54] GATE ARRAY HAVING I/O BIAS CIRCUIT FORMED FROM I/O CELL

[75] Inventor: Hiroyuki Hara, Fujisawa, Japan

[73] Assignee: Kabushiki Kaisha Toshiba, Kawasaki, Japan

[21] Appl. No.: 511,748

[22] Filed: Apr. 20, 1990

[30] Foreign Application Priority Data

Apr. 26, 1989 [JP] Japan .................. 1-106530

[51] Int. Cl.$^5$ .......................................... H01L 21/72
[52] U.S. Cl. ........................... 307/467; 307/296.6; 307/303.1; 307/455; 357/45
[58] Field of Search ............ 307/455, 465, 465.1–467, 307/296.6, 303.1; 357/45

[56] References Cited

U.S. PATENT DOCUMENTS

| | | | |
|---|---|---|---|
| 4,623,802 | 11/1986 | Cline et al. .................. | 307/296.6 |
| 4,631,427 | 12/1986 | Mazumder et al. ............ | 307/296.6 |
| 4,748,488 | 5/1988 | Suzuki et al. ................. | 357/45 |
| 4,751,406 | 6/1988 | Wilson ......................... | 307/455 |
| 4,904,887 | 2/1990 | Sugiyama et al. ............ | 307/467 |
| 4,933,576 | 6/1990 | Tamamura et al. ........... | 307/467 X |
| 4,942,317 | 7/1990 | Tanaka et al. ................ | 307/303.1 X |

OTHER PUBLICATIONS

Bräckelmann et al., "A 150-ps. 9000-Gate ECL Masterslice", *IEEE JSSC*, vol, SC-20, No. 5, Oct. 1985, pp. 1032–1035.

*Primary Examiner*—David Hudspeth
*Attorney, Agent, or Firm*—Banner, Birch, McKie & Beckett

[57] ABSTRACT

A gate array semiconductor integrated circuit includes a plurality of input/output cells, an input/output circuit, and a bias circuit. The plurality of input/output cells are arranged around an internal logic gate. The input/output circuit is formed by an aluminum master slice of the input/output cells and performs an input/output operation for the internal logic gate. The bias circuit is formed by the aluminum master slice of the input/output cells to supply a predetermined bias voltage to the input/output circuit.

4 Claims, 1 Drawing Sheet

GATE ARRAY HAVING I/O BIAS CIRCUIT FORMED FROM I/O CELL

BACKGROUND OF THE INVENTION

1. Field of the Invention

The present invention relates to a semiconductor integrated circuit and, more particularly, to a gate array semiconductor integrated circuit such as a gate array LSI.

2. Description of the Related Art

In a conventional gate array LSI, a plurality of bias circuits and a plurality of input/output cells, a predetermined number of input/output circuits of which are formed by an aluminum master slice, are arranged around an internal CMOS logic gate. The input/output circuits include a predetermined number of ECL input and ECL output circuits. Each bias circuit is arranged beforehand at a predetermined position on a chip to generate a bias voltage for obtaining a constant current and a bias voltage to be compared with an input signal and to supply these bias voltages to the input circuit and the output circuit respectively. An input/output cell portion excluding the bias circuits, therefore, can be used as the input or output circuits.

A predetermined number of conventional bias circuits are arranged beforehand regardless of the number of the input/output circuits before the input/output circuits are arranged, because large current drive ability is required. However, some bias circuits are often not used depending on the layout of the input/output circuits, and therefor redundancy in circuit design cannot be inevitably avoided in conventional circuits. The bias circuits are arranged at fixed positions and cannot perform input/output operations of other signals, resulting in inconvenience.

SUMMARY OF THE INVENTION

It is, therefore, an object of the present invention to provide a gate array semiconductor integrated circuit apparatus capable of arranging only necessary bias circuits by arranging the bias circuits for input/output circuits by an aluminum master slice of input/output cells.

It is another object of the present invention to provide a gate array semiconductor integrated circuit apparatus capable of performing input/output operations of other signals by variably changing positions of the bias circuits.

In order to achieve the above objects, a gate array semiconductor integrated circuit comprises:

a plurality of input/output cells arranged around an internal logic gate;

an input/output circuit, formed by an aluminum master slice of the input/output cells, for performing an input/output operation of a signal for the internal logic gate; and a bias circuit formed by the aluminum master slice of the plurality of input/output cells to supply a predetermined bias voltage to the input/output circuit.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will be described in detail with reference to the accompanying drawings.

Figure 1:
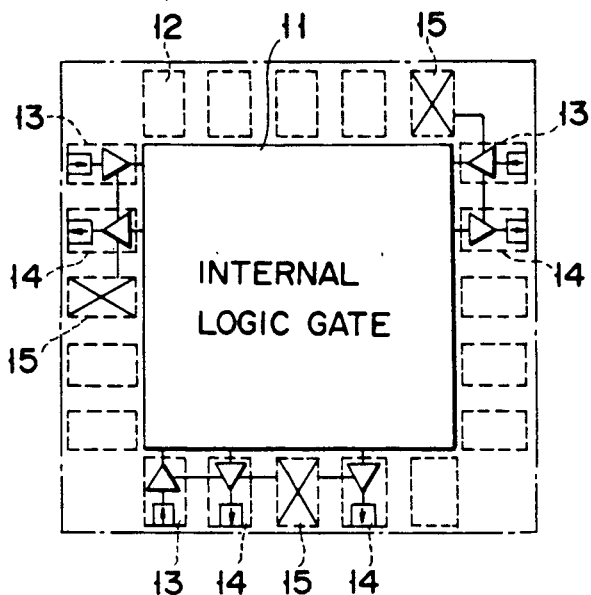
FIG. 1 is a schematic view showing an embodiment of the present invention.

FIG. 1 shows an embodiment of the present invention. In a gate array LSI, a plurality of input/output cells 12, a predetermined input/output or bias circuits and the like of which are formed by an aluminum master slice, are arranged around an internal CMOS logic gate 11. Predetermined numbers of ECL input circuits 13, ECL output circuits 14, and bias circuits 15 are formed by the aluminum master slice of the input/output cells 12.

That is, in the gate array LSI, the bias circuits 15 formed by the aluminum master slice of the input/output cells 12 generate bias voltages necessary for the input and output circuits 13 and 14 also formed by the aluminum master slice of the input/output circuits 12.

Figure 2:
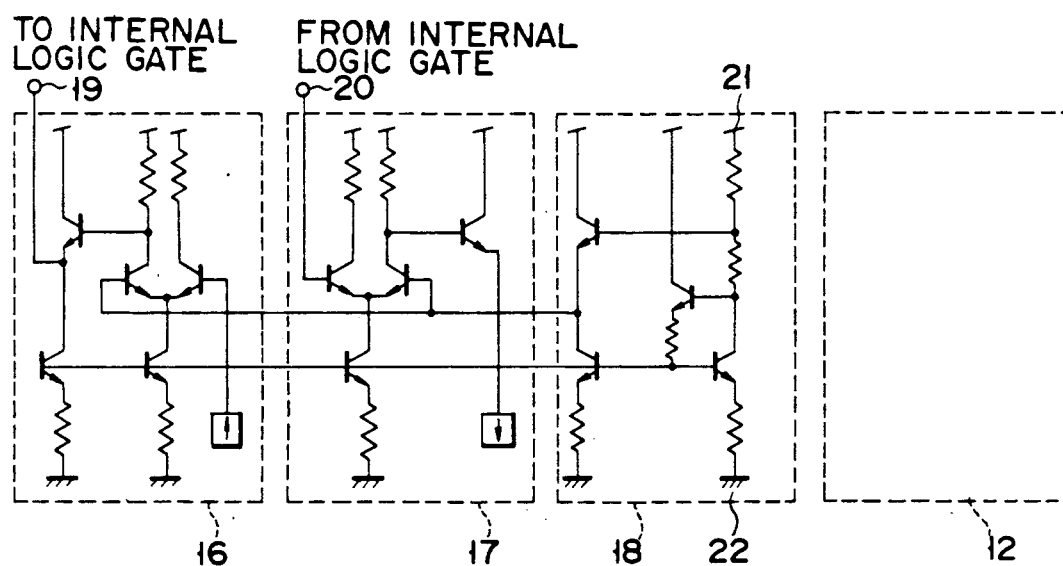
FIG. 2 is a circuit diagram showing a detailed arrangement of the present invention.

FIG. 2 shows a detailed arrangement of the present invention. An input circuit 16 and an output circuit 17 of a pseudo-ECL level formed by the aluminum master slice of the input/output cells 12 require a bias voltage for obtaining a constant current and a bias voltage to be compared with an input signal, respectively. A bias circuit 18 formed by the aluminum master slice of the input/output cells 12 generates these bias voltages. In FIG. 2, reference numeral 19 denotes a terminal for supplying the signals to the internal logic gate; 20, a terminal for receiving the signals from the internal logic gate; 21, a power source; and 22, ground.

As described above, since the bias circuits are arranged as needed, wasteful input/output cells need not be used, and the bias circuits can be arranged at any positions.

The circuit shown in FIG. 2 can be combined with a gate array LSI, an internal logic gate of which is operated at a CMOS level, to arrange different bias circuits on one chip.

Note that, as an application of the present invention, a third voltage can be generated from a power source or ground voltage and can be used as a power source for the input/output circuits.

As described above, according to the present invention, a non-used bias circuit need not be arranged by supplying the bias voltages to the input/output circuit from the bias circuit formed by the aluminum master slice of the input/output cells, and a gate array semiconductor integrated circuit apparatus capable of performing input/output operations of other signals can be provided by changing an arrangement of the bias circuit.

Additional advantages and modifications will readily occur to those skilled in the art. Therefore, the invention in its broader aspects is not limited to the specific details and, representative devices, shown and described herein. Accordingly, various modifications may by without departing from the spirit or scope of the general inventive concept as defined by the appended claims and their equivalents.

What is claimed is:

1. A gate array semiconductor integrated circuit, comprising:
    a plurality of input/output cells arranged around an internal logic gate;
    an input/output circuit, formed by an aluminum master slice of said input/output cells, for performing an input/output operation of a signal for said internal logic gate; and
    a bias circuit formed by said aluminum master slice of said plurality of input/output cells to supply a predetermined bias voltage to said input/output circuit.

2. A circuit according to claim 1, wherein said input/output circuit includes an ECL input/output circuit.

3. A circuit according to claim 2, wherein said ECL input/output circuit includes an ECL input/output circuit for performing an input/output operation of a signal of a pseudo-ECL level.

4. A circuit according to claim 1, wherein said bias circuit comprises means for generating a bias voltage for obtaining a constant current and a bias voltage to be compared with an input signal.

* * * * *